United States Patent [19]

Hulbert et al.

[11] Patent Number: 4,810,974
[45] Date of Patent: Mar. 7, 1989

[54] DRIFT COMPENSATED DIGITALLY TUNED VOLTAGE CONTROLLED OSCILLATOR

[75] Inventors: Thomas N. Hulbert; James J. Sesters; Earl E. Bradley, all of Colorado Springs, Colo.

[73] Assignee: Texas Instruments Incorporated, Dallas, Tex.

[21] Appl. No.: 67,335

[22] Filed: Jun. 26, 1987

[51] Int. Cl.$^4$ ................................. H03L 7/18
[52] U.S. Cl. ........................... 331/1 A; 331/17; 331/25
[58] Field of Search .............. 331/1 A, 15, 17, 25

[56] References Cited

U.S. PATENT DOCUMENTS

| | | | |
|---|---|---|---|
| 4,453,136 | 6/1984 | Kelland | 331/1 A |
| 4,614,917 | 9/1986 | Zelitzki et al. | 331/1 A |
| 4,677,394 | 6/1987 | Vollmer | 331/1 A |
| 4,692,713 | 9/1987 | Cordwell et al. | 331/1 A |
| 4,695,931 | 9/1987 | Yamaura et al. | 331/1 A X |

Primary Examiner—Eugene R. Laroche
Assistant Examiner—David Mis
Attorney, Agent, or Firm—Rene' E. Grossman; Melvin Sharp; James T. Comfort

[57] ABSTRACT

A compensated digitally tuned voltage controlled oscillator includes a voltage controlled oscillator circuit that is driven by a digital to analog converter. The digital to analog converter receives a digital input and converts it to a voltage to which the voltage controlled oscillator circuit will respond. A feedback circuit is connected between a digital input circuit and the output of the voltage controlled oscillator circuit and includes a comparator having one input connected to receive the output of the voltage controlled oscillator circuit and a second input connected to receive the output of a reference oscillator which is also provided. The output of the comparator is connected to influence the data that is applied to the digital to analog converter and to compensate for variations due to temperature and component aging.

15 Claims, 5 Drawing Sheets

DRIFT COMPENSATED DIGITALLY TUNED VOLTAGE CONTROLLED OSCILLATOR

BACKGROUND OF THE INVENTION

This invention relates to digitally tuned voltage controlled oscillators and in particular to digitally tuned voltage controlled oscillators for use in the microwave frequency range.

A microwave frequency tunable oscillator requires accurate tuning, fast settling time, stability and reasonable cost. The prior art systems include a direct synthesizer with frequencies derived from discrete oscillators or a phase lock loop synthesizer. The phase lock loop system is accurate and cost effective but lacks the required tuning speed. The direct synthesizer is fast and accurate but is very expensive. The digitally tuned voltage controlled oscillator is very fast and inexpensive but is susceptible to frequency inaccuracies due to environmental conditions. However, because a tunable microwave frequency oscillator requires linearity of better than $=0.25\%$ over a 25% bandwidth. the voltage controlled oscillator must be insensitive to inaccuracies caused by temperature change and immune to the effects of aging.

The prior art voltage collected oscillator system traditionally used a digitally tuned oscillator with an array of two or more programmable read only memories. PROMs are typically programmed at specified temperatures in order to cause a digital to analog converter that drives the digitally tuned oscillator output to keep the voltage controlled oscillator within a window of linearity and frequency. The tolerance is specified within a straight line. The percent linearity is determined by one half the window bandwidth divided by the full band width times 100.

The voltage controlled oscillator and sometimes the digital to analog converter that is used to provide control voltages to the voltage control oscillator must be heated in order to maintain a specified linearity and frequency accuracy over an operational temperature range. However, heating only compensates for environmental factors. The PROMs which are keyed to the initial voltage controlled oscillator accuracy and the voltage controlled oscillator are characterized by their vast linearity versus DC control voltage at specified temperatures. A PROM is programmed such that when addressed the PROM will provide on its output a digital representation of a voltage to drive the voltage controlled oscillator via the digital analog converter. The PROM programming is typically performed at a single temperature. This temperature is usually chosen at the mid range of the desired operating temperature range or at a temperature based on a heater's heating characteristic. Needless to say, the vast linearity of frequency is at a signal temperature. Degradation is expected over the remaining temperature range and an erorr is typically expected in the microwave range of 1 megahertz per degree centigrade. Heaters therefore become a prime requirement and must keep up with the environmental changes. However, there is also a point where the heater power is not practical.

A method of compensating for the effects of aging is to periodically reprogram the PROMs that drive the digital to analog converter to more accurate values.

SUMMARY OF THE INVENTION

A compensated digitally tuned voltage controlled oscillator includes a voltage controlled oscillator circuit that is driven by a digital to analog converter. The digital to analog converter receives a digital input and converts it to a voltage to which the voltage controlled oscillator circuit will respond. A feedback circuit is connected between a digital input circuit and the output of the voltage controlled oscillator circuit and includes a comparator having one input connected to receive the output of the voltage controlled oscillator circuit and a second input connected to receive the output of a reference oscillator which is also provided. The output of the comparator is connected to influence the data that is applied to the digital to analog converter and to compensate for variations due to temperature and component aging.

The compensated digitally tuned oscillator includes a down converter which down converts the output of the voltage controlled oscillator circuit to frequency levels that are more readily handled by the feedback circuit.

It is an object of the invention to provide a digitally tuned voltage controlled oscillator in which programmed data is periodically updated to compensate for temperature changing and aging.

These and other features and advantages would be more apparent from reading the specification in conjuntion with the figures in which:

DETAILED DESCRIPTION OF THE EMBODIMENTS

Figure 1:
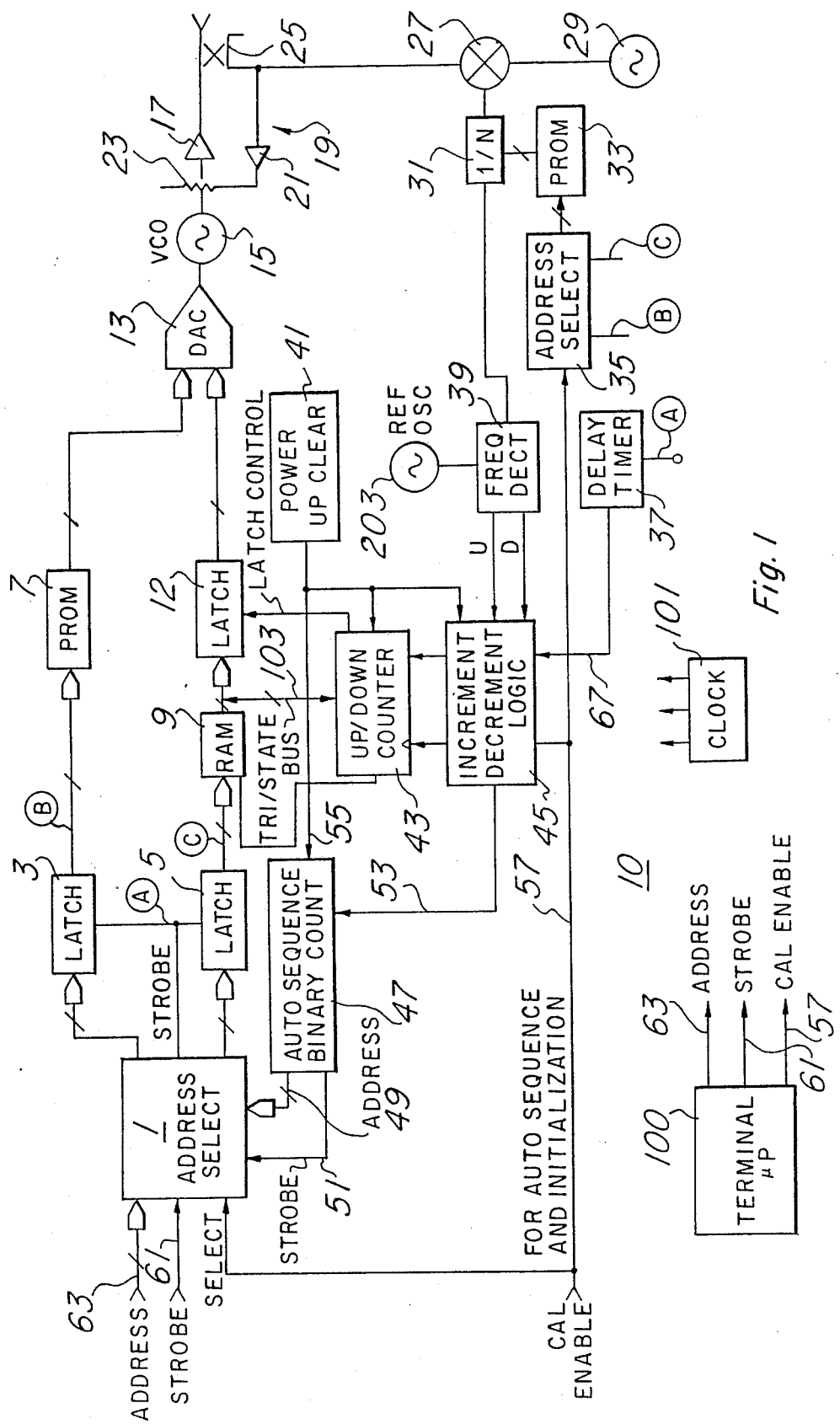
FIG. 1 is a block diagram of the digitally tuned voltage controlled oscillator according to the invention.

In FIG. 1 to which reference should now be made there is illustrated a terminal 100 which can be a traditional microprocessor controller that is programmed to provide address data via data bus 63, a strobe signal via conductor 61 and a calibrate enable signal via conductor 57 to the digitally tuned voltage controlled oscillator 10. Clock 101 provides the timing for the operation of FIG. 1. The digitally tuned voltage controlled oscillator 10 is programmed for various output frequencies by the address data and strobe signal. The address data provided by the terminal 100 is used to address a PROM 7 and a RAM 9 which are connected to apply digital data stored therein at the addressed location and representative of the desired output frequency from the digitally tuned voltage controlled oscillator 10 to a digital to analog converter 13. The outputs of the PROM 7 and the RAM 9 are applied to the digital to analog converter 13 with the output from RAM 9 being temporarily stored in a latch 12 to facilitate the updating the data stored in the RAM 9 at the addressed location for temperature and aging effects.

As was discussed earlier, the digital to analog converter 13 converts the digital information which is temperature compensated to an analog voltage which drives the output of the digitally tuned voltage controlled oscillator 10 to the desired frequency by causing a voltage controlled oscillator circuit 15 to change its output frequency.

A buffer amplifier 17 buffers the output of the voltage controlled oscillator circuit 15. A directional coupler 25 samples the output of the buffer amplifier 17 and applies it to a mixer 27. Additionally, an automatic gain control circuit 19 is provided on the output of the voltage controlled oscillator 15 and includes a feedback amplifier 21 and a variable attenuator 23.

The mixer 27 mixes the sampled signal that is sampled by the directional coupler 25 with the output of an oscillator 29. The down converted signal from the mixer 27 is applied to a divide by N counter 31, 1/N counter 31.

The address that is present on data bus 63 is connected to an address select circuit 35 via a tie point B which addresses a PROM 33. The PROM 33 contains the value of "N" which is loaded in the 1/N counter 31. The 1/N counter 31 performs the function of normalizing the downconverted signal for frequency comparison by a frequency detector 39.

Because the signal that is applied to the frequency detector 39 has been downconverted and normalized, the frequency detector 39 in the embodiment of FIG. 1 is a phase detector and compares the output of the 1/N counter 31 with the output of a reference oscillator 203. Based on this comparison, an up or down signal is indicated on the outputs of the frequency detector 39. As was previously stated the frequency detector 39 is a phase comparator which compares the phase of the down converter and normalized signal from the 1/N counter 31 with the phase of the output frequency from the reference oscillator 203 and based upon this comparison a phase error will either give a logic signal indicating that the output signal from the voltage controlled oscillator needs to be raised by the up command, U, or lowered by the down command, D.

An increment/decrement logic 45 inputs the data based upon the U or D signal to an up/down counter 43 which has stored therein the data from the RAM 9 that includes the least significant bits that have been stored in the latch 12. This output data from the increment/decrement logic is stored in the RAM 9 which of course does not affect the output of the digital to analog converter 13 due to the isolation provided by the latch 12, but at the occurrence of the next update cycle, the updated version previously updated by the up/down counter 43 and stored in RAM 9 is then transferred and stored in latch 12.

It should be noted that in the implementation of FIG. 1, the data is only changed one bit at a time such that if there is an error or temperature variation, the data that is applied to the digital to analog converter 13 will affect compensation for this variation over a periodic rate and thus the digitally tuned voltage controlled oscillator 10 will not have a rapid or erratic changes in output frequency.

There are times when it is desired to update the digitally tuned voltage controlled oscillator 10 over all bands of frequencies for specified temperatures or temperature ranges. An auto sequence binary counter 47 provides this function. A calibration enable signal, "cal enable", is applied from the terminal 100 to the digitally tuned voltage oscillator 10. The calibration enable signal connects address selectors 1 and 35 to the output of the auto sequence binary counter 47 which not only provides addresses to sequence through all the addresses of the PROM 7 and RAM 9, but additionally provides a strobe signal for application to tie point A for operation of the latches 3 and 5 and to delay timer 37.

The auto sequence binary counter 47, when initiated, sequences through all the addresses of the PROM 7 and the RAM 9 and thus it is obvious that by auto sequencing through the addresses at a specified temperature the output of the voltage controlled oscillator circuit 15 may be compensated to correct for anomalies due to component aging.

Figure 2:
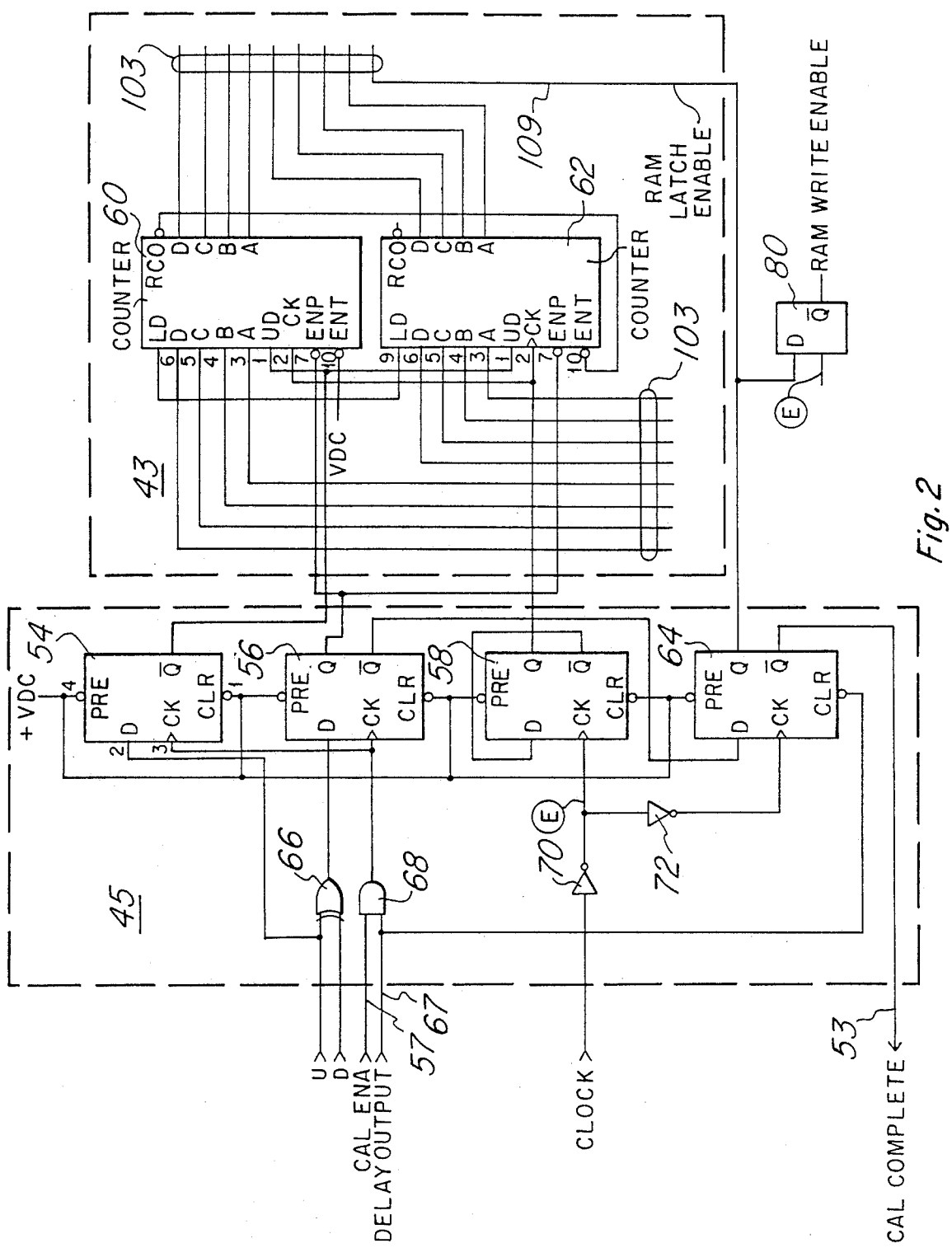
FIG. 2 is a schematic diagram of the increment, decrement logic of FIG. 1.

FIG. 2 is a schematic diagram of the up/down counter 43 and the increment/decrement logic 45. The output from the frequency detector 39 is applied to the U and D bus to an exclusive "OR" gate 66 which at the occurrence of either a delay output from the delay timer 37 via conductor 67 or a calibration enable signal applied thereto by conductor 57 sets a D type flip-flop 56. When the D flip-flop 56 sets the Q output, it indicates to the up/down counter 43 that a change to the digital data stored at the addressed location in the RAM 9 is to be implemented and loads the data on bi-directional data bus 103 into the up/down counter 43. D flip-flop 54 indicates the direction the up/down counter 43 is to count. A clock pulse from the clock source 101 toggles D flip-flop 58 which generates the clock pulses for clocking the up/down counter 43. D flip-flop 64 provides a calibration complete indication on conductor 53 to the auto sequence binary counter and controls the loading of the RAM 9 with compensated data.

The up/down counter 43 includes two counters 60 and 62 which, depending upon the state of D flip-flop 54 and 56, are loaded with data from the addressed location in RAM 9 and present on data bus 103. The counter 60 and 62 also provide compensated output data for loading into the RAM 9 at the addressed location via the same bi-directional data bus 103 at the calibration complete indication provided by D flip-flop 64. Thus, the sequence of events is the output of the RAM 9 is loaded into the up/down counter 43 which includes an up/down counter 60 and an up/down counter 62. If U is set to a 1, then the least significant bit of the two counters is increased by one. This compensated data is then stored within the RAM 9 and the next time that the RAM 9 is addressed by the data from latch 5, that compensated data is used to determine the output frequency of the VCO 15. This process is repeated so that temperature variations and drift due to aging are compensated for.

Figure 3:
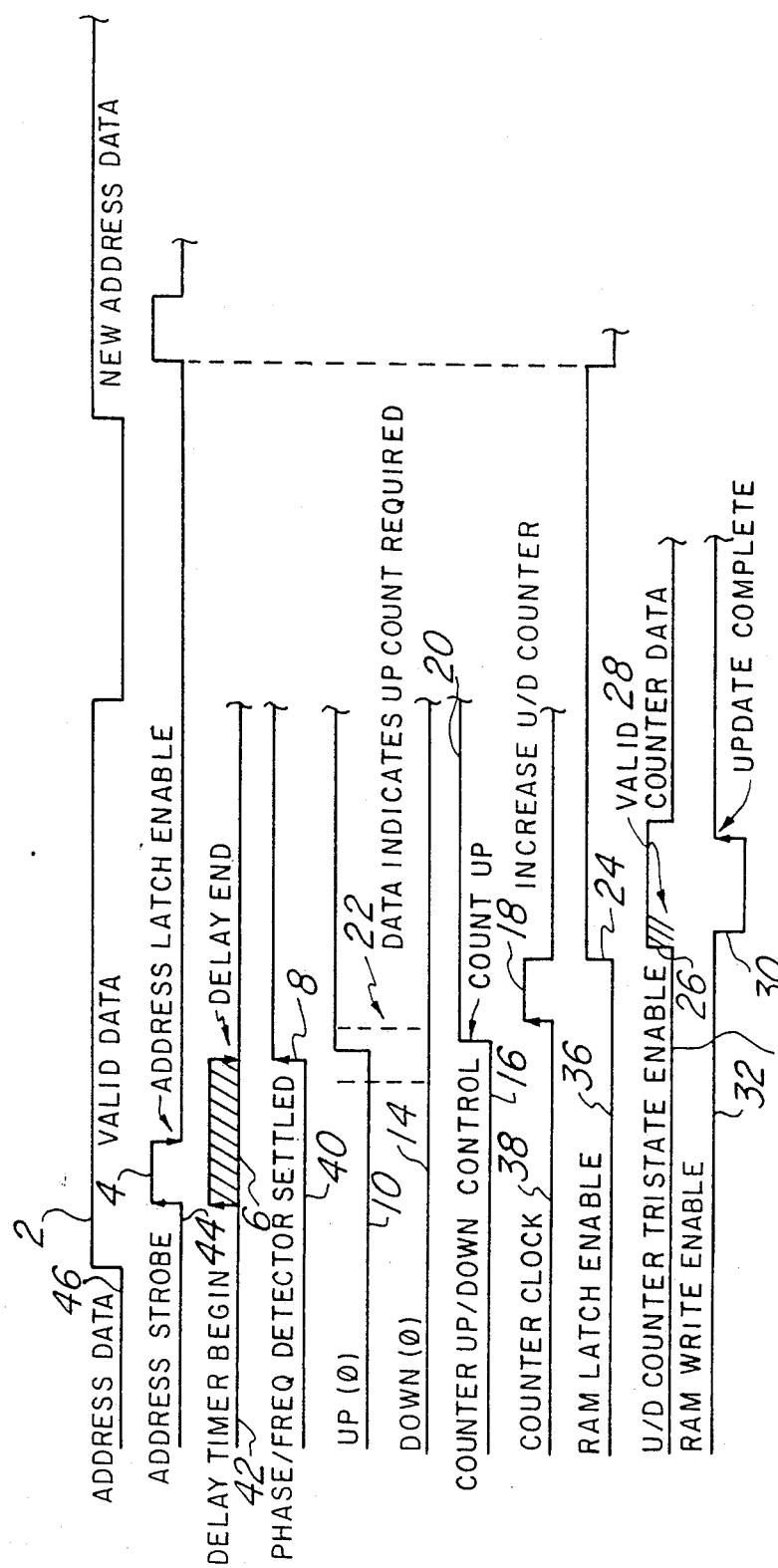
FIG. 3 is a waveform diagram illustrating the transfer of data to the digitally tuned voltage controlled oscillator.

FIG. 3 is a waveform diagram that illustrates the output of the terminal 100 and the operation of the digitally tuned voltage controlled oscillator 10 shown in FIG. 1. The address that is present on data bus 63 is represented by waveform 46 and at location 2 the data is valid. The address strobe called strobe in FIG. 1 is present on conductor 61 and is represented by waveform 44. The delay timer 37 of FIG. 1 is set concurrently with the beginning of the strobe pulse to allow settling of the output of the voltage controlled oscillator circuit 15. This time delay is represented by pulse 6 of waveform 42.

Waveform 40 shows the output of the frequency detector 39 which occurs after the digitally tuned voltage controlled oscillator 10 has settled which is at the expiration of the time delay from the delay time 37. This process is represented by waveform 8.

Waveforms 10 and 14 illustrate the U and D signal as either a positive pulse on the up side or on the down side at 22 which is applied to the increment/decrement logic 45. The counter up and down control as represented by waveform 16 and is provided by the output of D type flip-flop 45 produces an increment or decrement of the up/down counter 43. The counter clock is the output of D flip-flop 58 and is represented by waveform 38 at pulse 18. The RAM latch enable signal is the output of D flip-flop 64 and is represented by waveform 36 and is present on conductor 109 which is part of the conductor bundle 103. This signal enables the RAM 9 to accept the data that is present on bi-directional data bus 103 at the occurrence of pulse 24.

Waveform 34 is the output of D flip-flop 56 which controls the tristate output of the up/down counters 60 and 62. This enable is illustrated by waveform 34 at 26. RAM 9 is loaded by a half clock cycle delay following the rise of pulse 24, as illustrated by waveform 32 at pulse 30. D flip-flop 80 provides the RAM write enable signal that is represented by waveform 32. The RAM update is completed by the rising edge of pulse 30. D flip-flop 64 is the reset removing the RAM latch enable signal, pulse 24 of waveform 36.

Waveform 38 represents the output of D type flip-flop 58 which is the clock signal for counter 62 and provides a pulse at 18.

Figure 4:
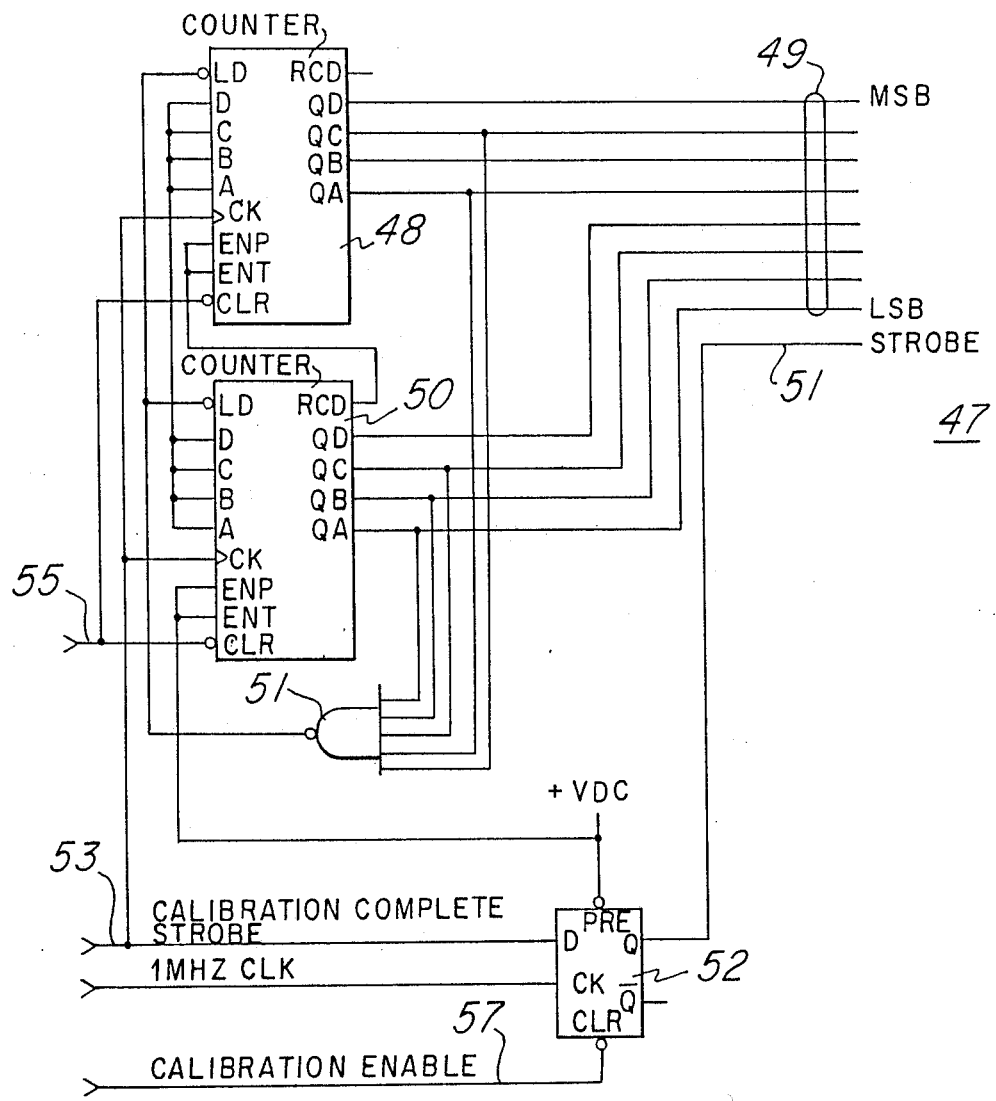
FIG. 4 is a schematic diagram of the auto sequence binary counter of FIG. 1.

FIG. 4 is a schematic diagram of the auto sequence binary counter 47 and includes two binary counters 48 and 50' NAND gate 51 resets the binary counters 47 and 48 at the completion of cycling through all of the addresses of the PROM 7 and RAM 9. The sequence is controlled by D type flip-flop 52 in response to the calibration complete strobe on line 53 and calibration enable pulse on line 57.

Figure 5:
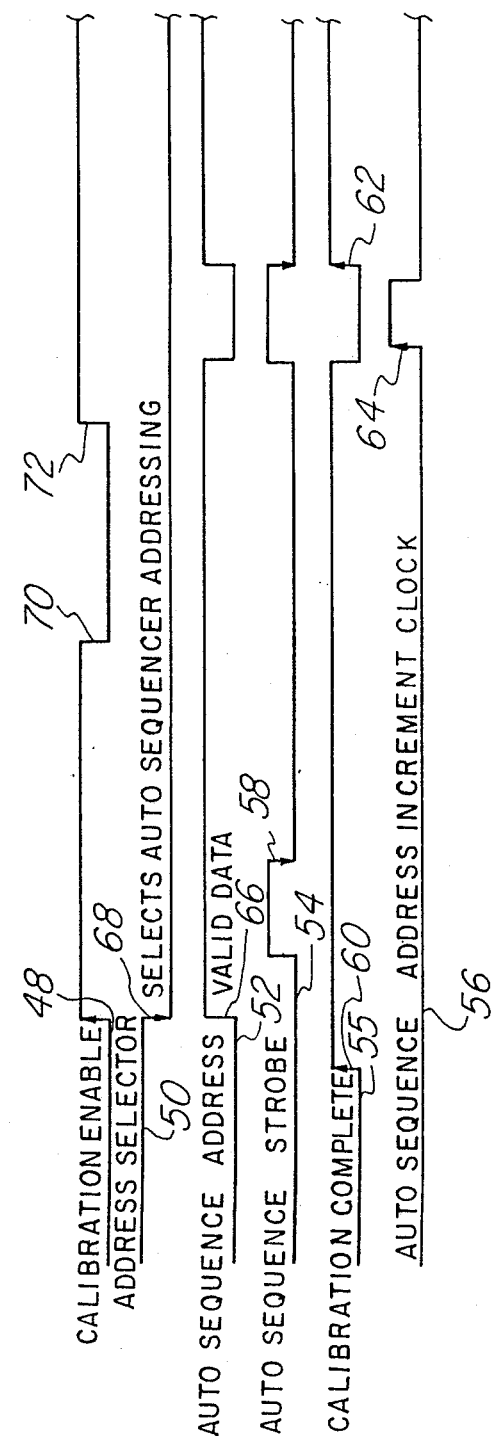
FIG. 5 is a waveform diagram illustrating the operation of the auto sequence binary counter according to the invention.

FIG. 5 is a waveform diagram illustrating the operation of the auto sequence binary counter 47 and includes waveform 48 which is the calibration enable signal that when present on conductor 51, causes the address selector 1 to connect latches 3 and 5 to data bus 49. This is illustrated by waveform 50 and, in particular, pulse 68. The valid data on the output of the auto sequence binary counter 47, data bus 49, is represented by waveform 52 and occurs at point 66. The auto sequence strobe, as was discussed in conjunction with FIG. 2, is provided at point 58 as is illustrated by waveform 54. Calibration complete occurs at pulse 62 of waveform 55 and the address increment clock occurs at point 64 of waveform 56 to increment the auto sequence binary counter 47 to the next address to be calibrated.

We claim:

1. A drift compensated digitally tuned voltage controlled oscillator comprising:
    a voltage controlled oscillator (VCO)
    a digital-to analog converter (DAC) having a first and second input and an output coupled to said VCO to provide a frequency determining voltage to said VCO;
    a digital input circuit (DIC) having first and second output channels, said first output channel provides fixed digital data to said first input of said DAC and said second output channel provides variable digital data which is updated during successive update cycles,
    a controller means coupled between said second output channel of said DIC and the second input of said DAC for storing the variable digital data present one update cycle immediately prior to the current update cycle while the data on said second output channel is revised during said current update cycle, and
    a feedback circuit coupled betwen said DIC and said VCO, said feedback circuit including a data adjust circuit, a reference oscillator and a comparator having one input coupled to said VCO and a second input coupled to said reference oscillator with the output of said comparator coupled to said data adjust circuit to adjust and update the data to said DIC during successive update cycles.

2. A drift compensated digitally tuned voltage controlled oscillator according to claim 1 wherein said DIC comprises a first memory for storing the most significant bits of said digital data which remain fixed during successive update cycles, and
   a second memory for storing and reading out the least significant bits of said digital data which varies during successive update cycles.

3. A drift compensated digitally tuned voltage controlled oscillator according to claim 1 wherein said controller is a latch which maintains said DAC at the previously updated value of said digital data until the next update cycle.

4. A drift compensated digitally tuned voltage controlled oscillator according to claim 2 wherein said first memory means is a ROM and said second memory means is a RAM, and said least significant bits change at most only one bit at a time.

5. A drift compensated digitally tuned voltage controlled oscillator according to claim 2 wherein said data adjust circuit comprises a counter and logic means coupled thereto, the output of said counter coupled to said second memory means and the output of said comparator coupled to the input of said logic means, said counter being incremented at each data cycle dependent upon the output value of said comparator.

6. A drift compensated digitally tuned voltage controlled oscillator according to claim 1 further including means for loading data into said DIC.

7. A drift compensated digitally tuned voltage controlled oscillator according to claim 6 wherein said means for loading further includes means for automatically sequencing said DIC and feedback circuit to compensate said VCO for drift.

8. A drift compensated digitally tuned voltage controlled oscillator according to claim 2 further including memory latch means coupled to the inputs of said first and second memories and address select means coupled to said latch means.

9. A drift compensated digitally tuned voltage controlled oscillator according to claim 8 further including means coupled to said address select means for automatically sequencing said DIC and feedback circuit to compensate said VCO for drift.

10. A drift compensated tuned voltage controlled oscillator according to claim 1 wherein said feedback circuit further includes a downconverter coupled between the output of said VCO and the input of said comparator.

11. A drift compensated digitally tuned voltage controlled oscillator according to claim 2 wherein said feedback circuit further includes an automatic gain control circuit coupled to the output of said VCO.

12. A drift compensated digitally tuned voltage controlled oscillator comprising a voltage controlled oscillator (VCO)
a digital-to analog converter (DAC) having
a first and second input and an output coupled to said VCO to provide a frequency determining voltage to said VCO,
a first and second memory means for producing digital data representative of said frequency determining voltage, said first memory means coupled to said first input of said DAC and stores the most significant bits of said digital data which remains fixed during successive update cycles and said second memory means stores and reads out the least significant bits of said digital data which may vary during successive update cycles,
latch means coupled between said second memory means and said DAC for storing the variable digital data present one update cycle immediately prior to the current update cycle while the data in said second memory means is revised during said current update cycle,
a feedback circuit coupled between said second memory means and said VCO, said feedback circuit including a data adjust circuit, a reference oscillator and a comparator having one input coupled to said VCO and a second input coupled to said reference oscillator with the output of said comparator coupled to said data adjust circuit to adjust and update the data to said second memory means during successive update cycles, and
logic means for loading data into said first and second memory means.

13. A drift compensated digitally tuned voltage controlled oscillator according to claim 12 wherein said first memory means is a ROM which stores the most significant bits of said digital data and the second memory means is a RAM which stores the least significant bits of said digital data, said least significant bits may vary by one bit at most for each successive update cycle.

14. A drift compensated digitally tuned voltage controlled oscillator according to claim 12 wherein said logic means for loading data comprises memory latch means coupled to said first and second memory means and address select means coupled to said memory latch means.

15. A drift compensated digitally tuned voltage controlled oscillator according to claim 14 wherein said logic means for loading data further includes an auto sequence logic means coupled to said address select means for automatically sequencing said first and second memory means to compensate said VCO for drift.

* * * * *